(12) United States Patent
Ceballos et al.

(10) Patent No.: US 7,961,129 B2
(45) Date of Patent: Jun. 14, 2011

(54) COUPLED DELTA-SIGMA MODULATORS

(75) Inventors: Jose Luis Ceballos, Villach (AT);
Andreas Bertl, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/539,879

(22) Filed: Aug. 12, 2009

(65) Prior Publication Data

US 2011/0037629 A1 Feb. 17, 2011

(51) Int. Cl.
*H03M 3/00* (2006.01)
(52) U.S. Cl. ......... 341/143; 375/276
(58) Field of Classification Search ........ 341/143–155
See application file for complete search history.

(56) References Cited

U.S. PATENT DOCUMENTS

| | | | | | |
|---|---|---|---|---|---|
| 5,103,229 | A | * | 4/1992 | Ribner | 341/143 |
| 5,153,593 | A | * | 10/1992 | Walden et al. | 341/143 |
| 5,341,135 | A | * | 8/1994 | Pearce | 341/143 |
| 5,834,987 | A | * | 11/1998 | Dent | 341/143 |
| 7,068,110 | B2 | * | 6/2006 | Frey et al. | 331/17 |
| 7,432,841 | B1 | * | 10/2008 | Kinyua | 341/143 |
| 7,554,472 | B2 | * | 6/2009 | Puma | 341/143 |
| 7,557,742 | B2 | * | 7/2009 | Kulinets et al. | 341/143 |

* cited by examiner

*Primary Examiner* — Lam T Mai
(74) *Attorney, Agent, or Firm* — SpryIP, LLC

(57) ABSTRACT

An apparatus and method for reducing error in converting a multi-bit signal to a single bit signal. An analog delta-sigma modulator receives an analog signal and converts it to a multi-bit digital signal that is provided to a digital delta-sigma modulator. The digital delta-sigma modulator introduces error by converting the multi-bit signal to a single-bit signal. The error from the conversion is fed back to the analog delta-sigma modulator which incorporates the error information into the analog signal before it is converted to a multi-bit digital signal.

17 Claims, 5 Drawing Sheets

US 7,961,129 B2

COUPLED DELTA-SIGMA MODULATORS

BACKGROUND

Sigma-delta converters are useful in such applications as communications systems and wireless Local Area Networks (LAN). These converters provide high dynamic range and flexibility in converting low bandwidth input signals. The general principle of the sigma-delta architecture is to make rough evaluations of a signal and to measure, integrate, and compensate for errors in the evaluation.

A conventional first order sigma-delta Analog-to-Digital Converter (ADC) has two primary components: a sigma-delta modulator and a digital filter. An input signal X is fed into the sigma-delta modulator and to an amplifying structure, such as an integrator, resonator, and/or passive structure (capacitor, resistor, inductor, and so forth), referred to as an integrator herein. The integrator distributes a converter quantization error, or quantization noise, such that it is very low in the band of interest according to well known techniques. The integrator outputs a signal that is input to a comparator. The output of the comparator is directed to a feedback Digital-to Analog Converter (DAC), which outputs an analog approximation signal Q back to be combined with the input signal X. The analog signal Q is subtracted from the analog input signal X in an attempt to reduce in-band quantization noise, and to force the average of the signal Q to be equal to the input signal X. The resulting output signal is sent through the comparator and provided as an output signal from the sigma-delta modulator to a digital filter, which may be a decimation filter.

The integrator, as described above, may be replaced with a filter that has a transfer function of $H(s)=1/s$. The quantizer may be modeled as a noise source, or a summation node, with a noise contribution of q. The quantization noise q is fed back using a feedback loop to be combined with the input signal. In summary, the error signal containing the noise q passes through a filter with high in-band frequency gain and high out-band frequency attenuation, which shapes the quantization noise spectrum. At least some of the quantization noise q is shifted to out-band frequencies, thus generating an output signal with mainly an in-band frequency of interest.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

Figure 1A:
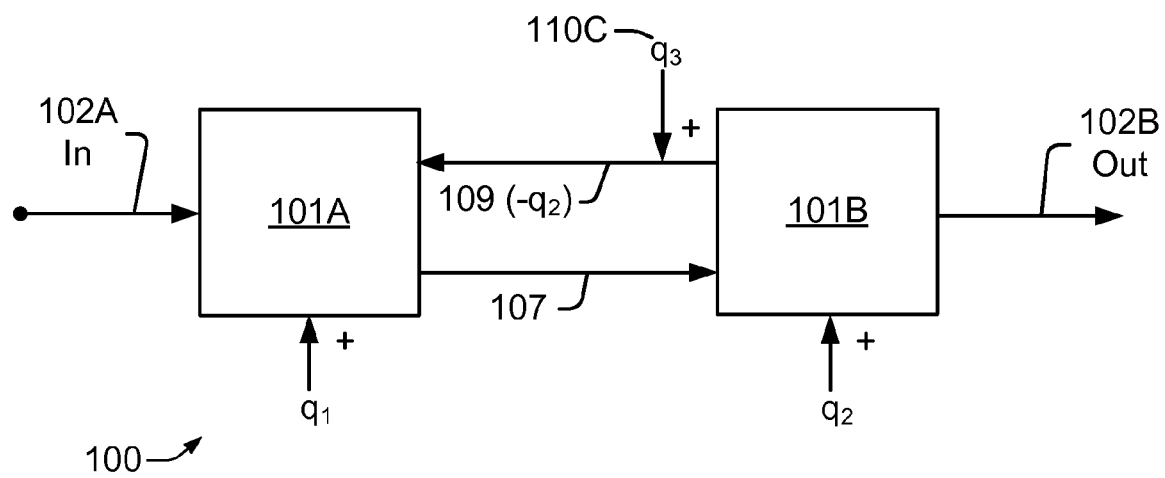
FIG. 1A are exemplary block diagrams for a coupled delta-sigma modulator in the frequency domain.

While the invention may be modified, specific embodiments are shown and explained by way of example in the drawings. The drawings and detailed description are not intended to limit the invention to the particular form disclosed, and instead the intent is to cover all modifications, equivalents, and alternatives falling within the spirit and scope of the present invention as defined by the claims.

DETAILED DESCRIPTION

Disclosed herein is a coupled sigma-delta converter that uses at least two sigma-delta modulators that are coupled together. In general, techniques in accordance with the present disclosure may reduce or cancel noise associated with processing and converting digital signals.

In one implementation, a first sigma-delta converter is coupled to a second sigma delta modulator. The second delta-sigma modulator receives a first digital signal from the first delta-sigma modulator. The second delta-sigma modulator is configured to convert the first digital signal into a second digital signal and introduces an error associated with the second digital signal as a result of the conversion of the first digital signal. The error is fed-back to the first delta-sigma modulator and the first sigma-delta modulator uses the error in providing the first digital signal.

Exemplary System

FIG. 1A

FIG. 1A shows a coupled delta-sigma modulator (DSM) 100 that includes the analog DSM 101A and the digital DSM 101B. The coupled DSM 100 may accept an analog input signal 102A and output a single-bit digital signal 102B. In many situations, a single-bit output may be desired. However, for many reasons, a sigma-delta modulator is more efficient and accurate when it internally uses a multi-bit analog-to-digital conversion. Moreover, a multi-bit DSM offers many advantages to designers of a DSM. The analog DSM 101A may provide a multi-bit digital signal 107 to the digital DSM 101B. The digital DSM 101B includes a feedback loop 109 to substantially eliminate any noise introduced in this system 100.

The analog DSM 101A may have a noise contribution of q1; the digital DSM 101B may have a noise contribution of q2. The magnitude of q2 may be larger than q1. The feedback loop itself may introduce additional noise q3, however, the noise q3, just like q1, may be smaller than the q2 noise. In one embodiment, the coupled DSM 100 is configured to reduce or remove the noise contribution q2 from the system. Alternative embodiments may additionally or alternatively minimize the noise contributions from q1 and q3, either independently or in conjunction with reducing the noise contribution q2.

FIG. 1B

Figure 1B:
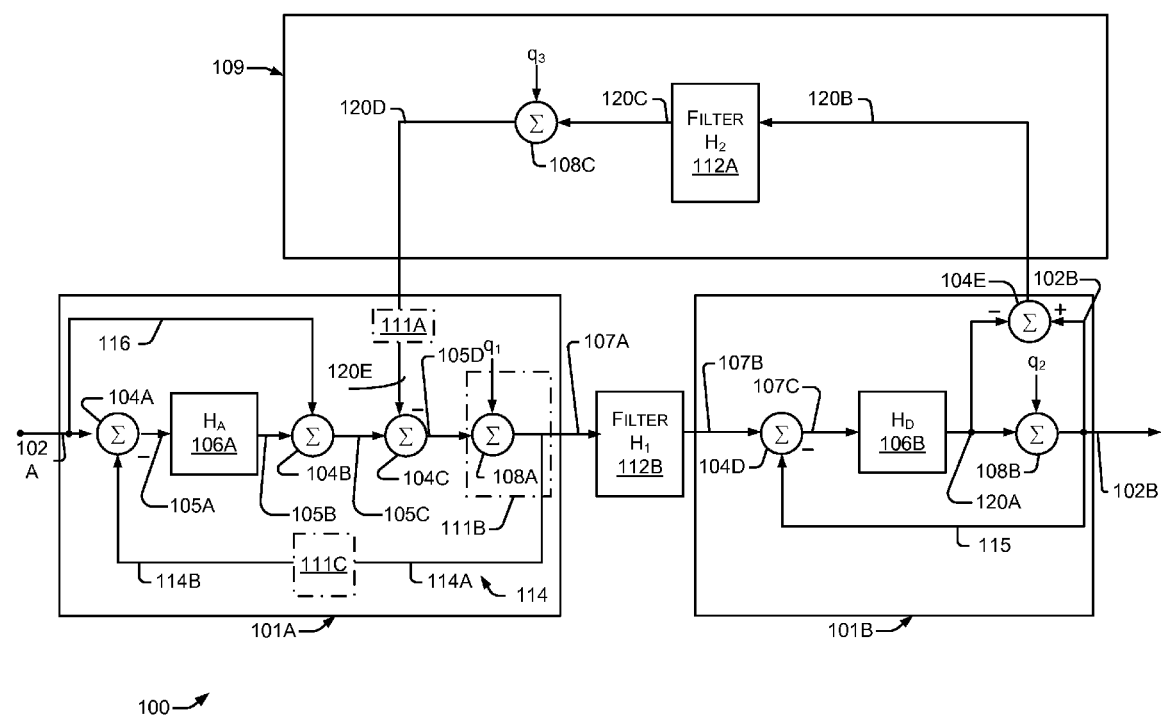
FIG. 1B is a detailed exemplary block diagram of a coupled delta-sigma modulator.

FIG. 1B illustrates an exemplary coupled delta-sigma modulator 100, according to certain embodiments. It is noted that the elements of FIG. 1B do not necessarily correspond to physical components. Instead, they may represent logical portions of the one or more physical components. Specifically, FIG. 1B shows a model of the coupled DSM. In the frequency domain, an integrator may be replaced by a filter with a transfer function. Similarly, a quantizer may be replaced by a noise source with a noise contribution. At least parts of the coupled delta-sigma converter 100 may be implemented in hardware or software. In fact, parts of the coupled delta-sigma converter 100 of FIG. 1B are shown with actual hardware components, e.g., digital-to-analog converters, in order to better explain the system. The signals represented in the schematic of the coupled delta-sigma converter 100 may be carried using physical paths; however, these physical paths are not shown in FIG. 1B, as FIG. 1B shows a schematic and not an exemplary physical implementation. For example, it is noted that in FIG. 1B some of the summation nodes, e.g., 104A-D may be mere representations of functionality that is performed by a respective delta-sigma modulator 101A/B and/or a respective filter 106A/B. Furthermore, some summation nodes, e.g., 108A-C may be mere representations of quantization noise added by another operation and/or element. For example, the summation node 108A shows the addition of quantization noise q1 from analog-to-digital (ADC) converter 111B that converts an analog intermediate signal 105D to the multi-bit digital signal 107A. Additionally, some or all of the elements of FIG. 1B may be implemented using one or more of a Field Programmable Gate Array (FPGA), an application-specific integrated circuit (ASIC), or a hybrid programmable device. Furthermore, some or all of the elements of FIG. 1B may be implemented using a processor and memory, such as by storing and executing instructions for performing some or all of the functionality of digital signal processing elements of FIG. 1B.

Similar to FIG. 1A, FIG. 1B illustrates the coupled delta-sigma modulator (DSM) system 100 using a hybrid architecture, which is so called because it accepts an analog input signal 102A, and uses a first DSM 101A to provide a first digital signal 107A. The first digital signal 107A, may be carried using two or more separate lines (not shown), where the digital output signal corresponds to a digitized version of the analog input signal. In an alternative implementation, the first digital signal 107A may be passed through a filter 112B before being provided to a digital DSM 101B. Hence, the received first digital signal 107B may be filtered or unfiltered. The second DSM 101B converts the first digital signal 107B to a second digital signal 102B. The second DSM 101B provides error information associated with the conversion of the first digital signal 107B to the second digital signal 102B to the first DSM 101A. As mentioned above, the first DSM 101A uses the analog input signal 102A and the error information to provide the first digital signal 107A.

In one implementation, the digital DSM 101B is configured to receive the multi-bit digital signal 107B and to output a single-bit digital signal 102B and the error information signal 120B. In an alternative implementation, the multi-bit digital signal 107A may use a separate line per each bit, e.g., it may use 5 lines for a 5-bit signal. In certain embodiments, a single line between components may represent more than one bit. For example, a single line may transfer 5-bits instead of 1-bit using any one of several multiplexing techniques known to a person of ordinary skill in the art.

As further shown in FIG. 1B, the analog DSM 101A receives a truncated error information signal 120D which is converted to an analog error information signal 120E by digital-to-analog converter 111A. In one implementation, the digital-to-analog converter 111A may be a low performance digital-to-analog converter. For example, the digital-to-analog converter 111A may be a 3-bit or 4-bit device.

In general, the error information provided to the analog DSM 101A, via error information signal 120D, is used to adjust the signal output by the analog DSM 101A, i.e., the first digital signal 107A. In one implementation, the analog input signal 102A is provided to node 104B along path 116 and to node 104A where the analog input signal 102A is combined with a feedback analog signal 114B to create a combined analog signal 105A that is provided to an analog loop filter 106A. The analog loop filter 106A is configured to provide a filtered combined analog signal 105B. The analog loop filter 106A may be configured to be a low pass filter that has high in-band gain. The bypass analog input signal 116 is combined with the filtered combined analog signal 105B at node 104B to form a by-pass combined analog signal 105C. The analog error information signal 120E is combined with the by-pass combined analog signal 105C to provide the combined signal 105D to the analog-to-digital converter 111B. The digital signal 107A is provided by the analog-to-digital converter 111B which is used by the digital DSM 101B.

Figure 1C:
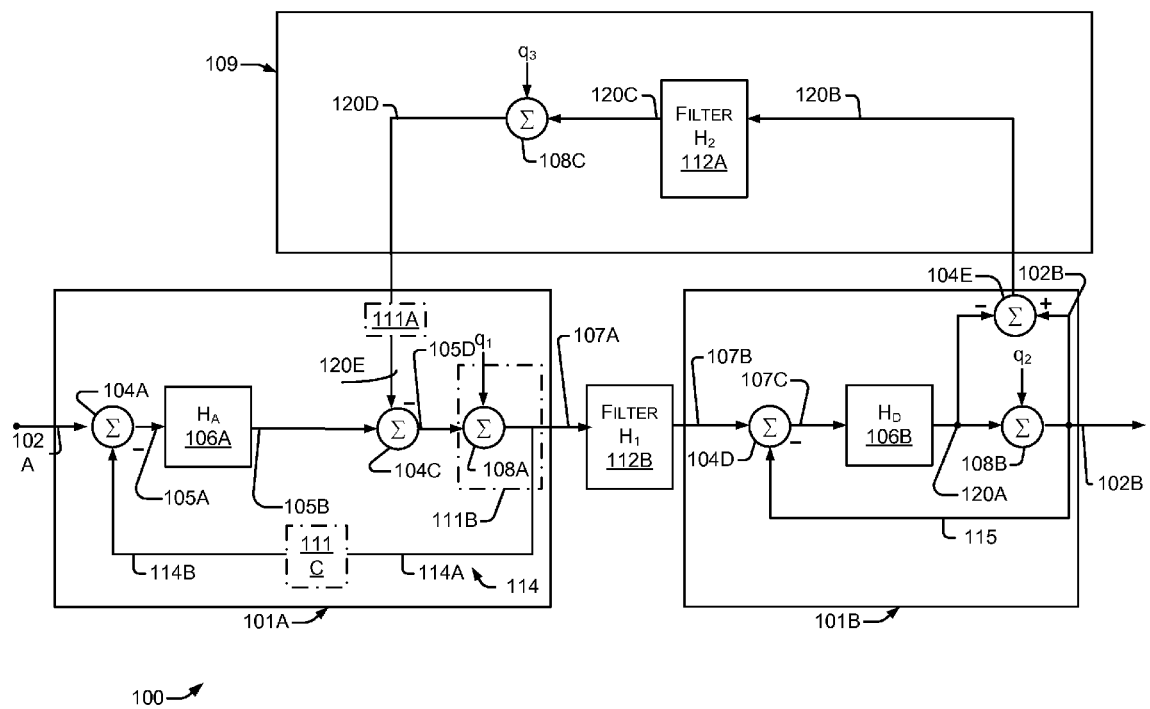
FIG. 1C is another embodiment of a detailed exemplary block diagram of a coupled delta-sigma modulator.

In another implementation illustrated by FIG. 1C, the analog input signal 102A may be combined with the feedback analog signal 114B, wherein the path 116, of FIG. 1B, is not present in this alternative implementation, and the combined analog signal 105A is provided to analog loop filter 106A. Since the by-pass analog input signal 116 is not implemented, then the summation node 104B is not necessary and the analog signals 105B and 105C are the same signal. Next, the filtered combined analog signal 105B is combined with the analog error information signal 120E at node 104C the combined signal 105D is provided to an analog-to-digital converter 111B that provides the multi-bit digital signal 107A.

Figure 1D:
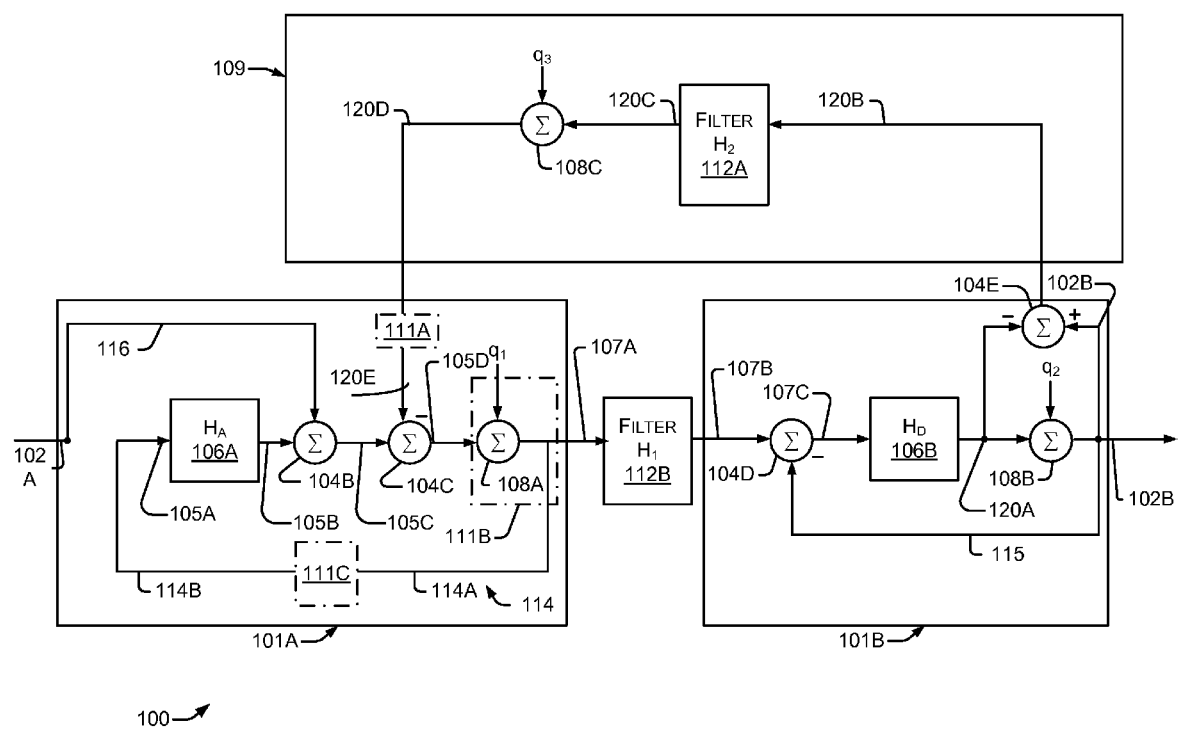
FIG. 1D is another embodiment of a detailed exemplary block diagram of a coupled delta-sigma modulator.

In yet another alternative implementation illustrated by FIG. 1D, the analog input signal 102A may by-pass the filter 106A entirely and is not combined with the feedback analog signal 114B (i.e. it is directed along path 116 and is not provided to the summation node 104A). For example, according to the alternative implementation, only the feedback analog signal 114B is processed by the filter 106A and the analog input signal 102A is combined with the output signal 105B of the filter 106A at node 104B.

As further shown in FIG. 1B, the filtered combined analog signal 105C is combined with the analog error information signal 120E at node 104C to form the dithered analog signal 105D that is converted to the multi-bit digital signal 107A. Also, the analog-to-digital converter 111B may have a quantization error q1 associated with it, as represented at node 108A. The multi-bit digital signal 107A is provided as an output of the analog DSM 101A and is also fed-back to a digital-to-analog converter 111C, which provides the feedback analog signal 114B. In certain implementations, the digital signal 107A may be a multi-bit signal, meaning that it may be propagated using multiple physical paths. For example, four paths may be used to propagate the multi-bit signal 107A, such that it has four resolution bits—bit0, bit1, bit 2, and bit3, where bit0 is the least-significant bit (LSB), and bit3 is the most-significant bit (MSB). However, bit0 may be the MSB and bit3 may be the LSB when used in a different endian configuration. In certain implementations, other resolutions of the multi-bit signal 107A may be used in accordance with the spirit of this description.

As further show in FIG. 1B, the digital DSM 101B is configured to receive the multi-bit digital signal 107B and output a single-bit digital signal 102B and an error information signal 120B. The single-bit digital signal 102B may be used in several different implementations, but the implementations described below are not intended to limit the scope of the claimed invention. First, the single-bit digital signal 102B is provided as an output of the digital DSM 101B. Second, the single-bit digital signal 115 is fed-back and subtracted from the multi-bit digital signal 107B at node 104D. Node 104D provides the combined signal 107C to a digital loop filter 106B. The digital loop filter 106B provides filtered digital signal 120A to a truncator 108B that provides a single-bit digital signal 102B. The single-bit digital signal 102B that includes quantization noise q2 as a result of the truncation. In one implementation, the digital loop filter 106B is a low pass filter with a high in-band gain. Additionally, the digital loop filter 106B and the previously mentioned analog loop filter 106A may be of the same order and type, but the analog and digital loop filters are not required to be the same type or order as long as they are matched well in the frequency band of interest for the coupled delta-sigma modulator. Third, the single-bit digital signal 102B may also be combined with the filtered digital signal 120A at node 104E in order to provide the error information signal 120B.

As further shown in FIG. 1B, the feedback loop 109 is configured to receive the error information signal 120B from the digital DSM 100B and provide a truncated digital feedback signal 120D to the analog DSM 101A. The error information signal may be filtered by filter 112A which provides a filtered error signal 120C to a truncator represented by node 108C. The truncator 108C truncates the filtered error information signal 120C and provides the truncated digital error information signal 102D to the analog DSM 101A. The truncation, as represented by the summation node 108C, may truncate the output filter signal 120C to a smaller number of bits. For example, the truncation operation may truncate the exemplary digital feedback signal 120C from 20-bits into three most significant bits (MSB) bits. In other words, the other, least significant bits (LSB) are discarded.

FIG. 2

Figure 2:
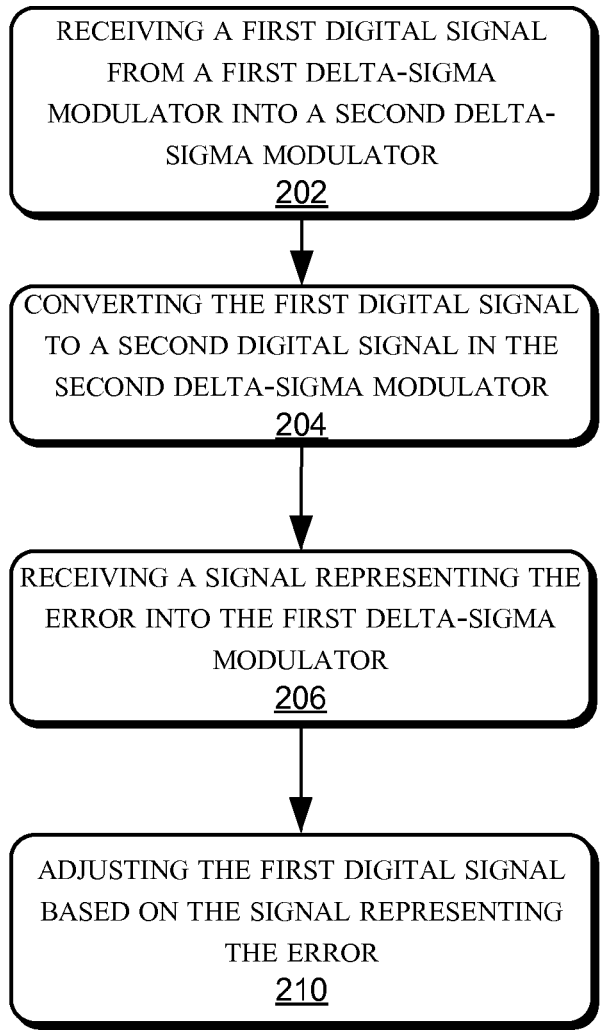
FIG. 2 is an exemplary flow diagram of a process for using a coupled delta-sigma modulator.

FIG. 2 is a flowchart of a method 200 for using a coupled delta-sigma modulator that reduces the impact of quantization noise that is generated when converting a first digital signal to a second digital signal. Specifics of exemplary methods are described below. However, it should be understood that certain acts need not be performed in the order described, and may be modified, and/or may be omitted entirely, depending on the circumstances. The method 200 will be described by way of example with reference to FIG. 1B.

At 202, an incoming first digital signal from a first DSM is received by a second DSM. For example, the first digital signal 107B, provided by a first DSM 101A, is received by the second DSM 101B. As described above, an optional low-pass filter 112B may be used to filter-out at least a portion of the out-of-band frequency noise in the multi-bit digital signal 107A. This filtering narrows the bandwidth of the multi-bit digital signal 107A, thus allowing the digital sigma-delta converter 100B to operate more efficiently in a smaller dynamic range.

At 204, the first digital signal is converted to a second digital signal in the second DSM. For example, the filtered digital signal 107A is truncated to form the second digital signal 102B. The filtered digital signal 120A is combined with the second digital signal 102B to provide a signal representing the error associated with the truncation of the filtered digital signal 120A.

At 206, a signal representing the error is received by the first DSM. The signal representing the error 120B is provided by the second DSM 101B.

At 208, the first digital signal is adjusted based on the signal representing the error. For example, the signal representing the error 120E is combined with the filtered combined analog signal 105C to provide a dithered analog signal 105D that is converted to a first digital signal 107A. In alternative implementations, the digital signal 120D may be provided directly to the analog-to-digital converter 111B in order to adjust the first digital signal 107A to account for the quantization noise q2 introduced at node 108B.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. For example, the systems described could be configured as monitoring circuits and incorporated into various feedback and control loops. In addition, the voltage converter circuit may include other types of voltage converter circuits in various analog and digital configurations.

The invention claimed is:

1. A coupled delta-sigma modulator comprising:
   a first delta-sigma modulator; and
   a second delta-sigma modulator, wherein:
      the second delta-sigma modulator is configured to:
      receive a first digital signal from the first delta-sigma modulator,
         wherein further the first digital signal is a multi-bit digital signal, convert the first digital signal to a second digital signal,
         wherein further the second digital signal is a single-bit digital signal, the conversion of the first digital signal introduces an error into the second digital signal, and the error includes quantization noise associated with the conversion of the multi-bit digital signal to the single-bit digital signal, and
      the first delta-sigma modulator is configured to receive a signal representing the error and to incorporate the error into the first digital signal using the signal representing the error.

2. The coupled delta-sigma modulator of claim 1, wherein:
   the first delta-sigma modulator is an analog delta-sigma modulator; and
   the second delta-sigma modulator is a digital delta-sigma modulator.

3. The coupled delta-sigma modulator of claim 1, further comprising:
   a filter configured to reduce the amount of high frequency noise in the first digital signal provided to the second delta-sigma modulator.

4. The coupled delta-sigma modulator of claim 1, wherein the first delta-sigma modulator is configured to:
   receive an analog input signal;
   provide a combined analog signal to a filter, the combined analog signal including the combination of the analog input signal and a feedback analog signal;
   provide a filtered combined analog signal from the filter to an analog-to-digital converter;
   dither the analog-to-digital converter with the signal representing the error in order to provide the first digital signal; and
   feed back the first digital signal to a digital-to-analog converter to provide the feedback analog signal as an output of the digital-to-analog converter.

5. The coupled delta-sigma modulator of claim 1, wherein the signal representing the error is filtered to remove high frequency noise before the signal representing the error is provided to the first delta-sigma modulator.

6. The coupled delta-sigma modulator of claim 1, wherein the second delta-sigma modulator is further configured to:
   feed back and subtract the second digital signal from the first digital signal;
   filter the first digital signal in a filter to reduce high frequency noise to provide a filtered digital signal prior to truncating the first digital signal;
   combine the filtered first digital signal and the second digital signal to produce the signal representing the error; and
   output the second digital signal from the second delta-sigma modulator.

7. The coupled delta-sigma modulator of claim 4, wherein the first delta-sigma modulator is further configured to truncate the signal representing the error before it is provided to the first delta-sigma modulator.

8. A method for digitizing signals, comprising:
receiving a first digital signal from a first delta-sigma modulator into a second delta-sigma modulator,
wherein the first digital signal is a multi-bit digital signal;
converting the first digital signal to a second digital signal in the second delta-sigma modulator,
wherein the second digital signal is a single-bit digital signal, the converting of the first digital signal introduces an error into the second digital signal, and the error includes quantization noise associated with converting the multi-bit digital signal to the single-bit digital signal;
receiving a signal representing the error into the first delta-sigma modulator; and
adjusting the first digital signal based on the signal representing the error.

9. The method of claim 8, wherein:
the first delta-sigma modulator is an analog delta-sigma modulator; and
the second delta-sigma modulator is a digital delta-sigma modulator.

10. The method of claim 8, further comprising:
filtering the first digital signal to remove high frequency noise from the first digital signal before the first digital signal is provided to the second delta-sigma modulator.

11. The method of claim 8, further comprising:
filtering the signal representing the error to remove high frequency noise before the signal representing the error is provided to the first delta-sigma modulator.

12. The method of claim 8, further comprising:
receiving an analog input signal into the first delta-sigma modulator;
generating a combined analog signal by combining the analog input signal and a feedback analog signal;
providing the combined analog signal to a filter in the first delta-sigma modulator;
providing a filtered combined analog signal from the filter to an analog-to-digital converter in the first delta-sigma modulator;
dithering the analog-to-digital converter with the signal representing the error in order to provide the first digital signal;
feeding back the first digital signal to a digital-to-analog converter to provide the feedback analog signal as an output of the digital-to-analog converter; and
outputting the first digital signal from the first delta-sigma modulator.

13. The method of claim 8, further comprising:
feeding back and subtracting the second digital signal from the first digital signal in the second delta-sigma modulator;
filtering the first digital signal in a filter to reduce the high frequency noise in the first digital signal prior to truncating the first digital signal in the second delta-sigma modulator;
combining a filtered first digital signal and the second digital signal, after truncating the first digital signal, to produce the error information signal in the second delta-sigma modulator;
outputting the second digital signal from the second delta-sigma modulator.

14. An apparatus comprising:
a first component configured to receive an analog signal and provide a multi-bit digital signal;
a second component configured to convert the multi-bit digital signal to a single-bit digital signal, and to output an error signal associated with the conversion; and
a third component configured to receive the error signal, attenuate a high frequency portion of the error signal, and provide an attenuated error signal to the first component,
wherein the first component is configured to provide the multi-bit digital signal by dithering the analog signal using the attenuated error signal, thereby providing a dithered analog signal, and converting the dithered analog signal into the multi-bit digital signal.

15. The apparatus of claim 14, wherein the first component is an analog delta-sigma modulator and the second component is a digital delta-sigma modulator.

16. The apparatus of claim 14, wherein the first component is configured to attenuate a high frequency portion of the analog signal prior to the dithering of the analog signal.

17. The apparatus of claim 14, wherein the second component is configured to attenuate a high frequency portion of the multi-bit digital signal prior to converting the multi-bit digital signal to the single-bit digital signal.

* * * * *